| United States Patent [19] | [11] Patent Number: 4,559,550 |
| --- | --- |
| Koike et al. | [45] Date of Patent: Dec. 17, 1985 |

[54] CCD TYPE SOLID-STATE IMAGING DEVICE

[75] Inventors: Norio Koike, Tokyo; Shinya Ohba, Kanagawa; Toshiaki Masuhara, Tokyo, all of Japan

[73] Assignee: Hitachi, Ltd., Tokyo, Japan

[21] Appl. No.: 548,576

[22] Filed: Nov. 4, 1983

[30] Foreign Application Priority Data

Nov. 8, 1982 [JP] Japan ................... 57-195815

[51] Int. Cl.$^4$ .............. H01L 29/78; H01L 27/14; H01L 31/00; G11C 19/28

[52] U.S. Cl. ................................ 357/24; 357/30; 377/62

[58] Field of Search ............... 357/24, 30; 377/57–63; 307/311

[56] References Cited

U.S. PATENT DOCUMENTS

| 4,199,691 | 4/1980 | Angle | 357/24 |
| 4,211,936 | 7/1980 | Kosonocky et al. | 357/24 |
| 4,237,383 | 12/1980 | Kosonocky et al. | 357/24 |
| 4,382,193 | 5/1983 | Grueter | 357/24 |

Primary Examiner—Gene M. Munson
Attorney, Agent, or Firm—Antonelli, Terry & Wands

[57] ABSTRACT

A solid-state imager includes vertical CCD shift registers for transferring photogenerated signal charge packets produced by a group of photodiodes belonging to a first series, vertical CCD shift registers for transferring photogenerated signal charge packets produced by photodiodes belonging to a second series, a horizontal CCD shift register for receiving signal charge packets shifted through both the vertical shift registers and transferring them to an output circuit and a coupling circuit provided between the horizontal CCD shift register and both the vertical CCD shift registers, all the components being formed on a single semiconductor substrate. Through the coupling circuit, one of two series of photogenerated signal packets transferred from both the vertical CCD shift registers located adjacent to each other are transferred to the horizontal CCD shift register beneath a set of storage electrodes thereof, which is followed by the transfer of the other series of signal charge packets to the horizontal shift register beneath other set of storage electrode. The horizontal CCD shift register transfers sequentially and alternately two series of the photogenerated signal charge packets to an output circuit. Two series of the signal charge packets can thus be transferred through the single horizontal CCD shift register.

6 Claims, 11 Drawing Figures

FIG. I
PRIOR ART

F I G. 2
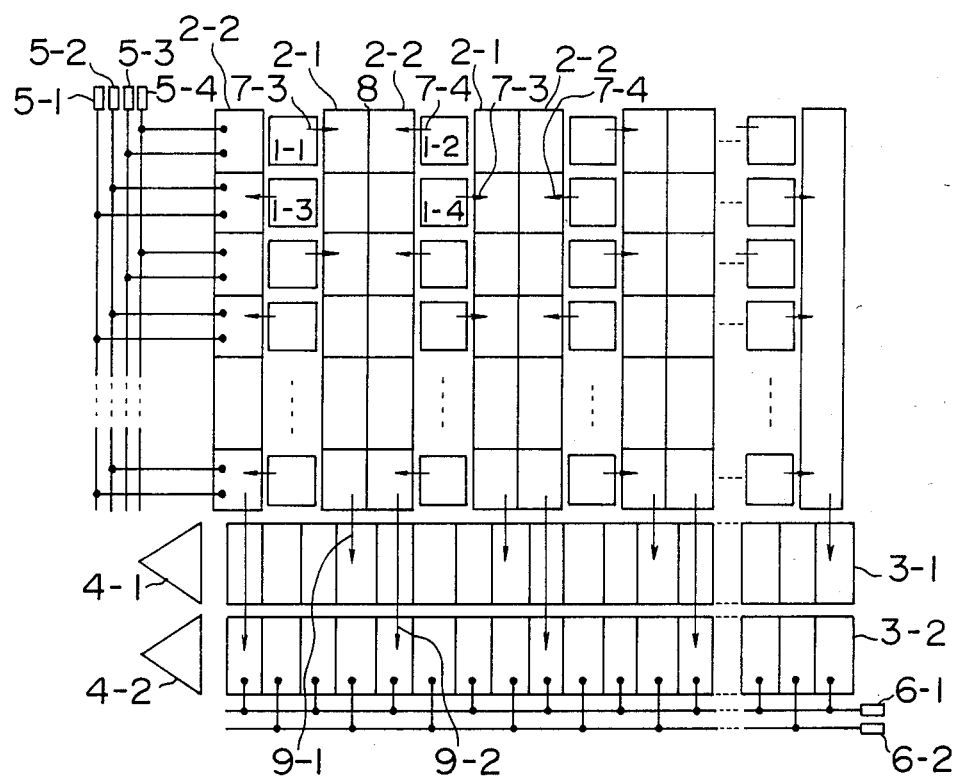

FIG. 7a

| G | R |
|---|---|
| B | G |

FIG. 7b

| Cy | W |
|----|---|
| Ye | G |

CCD TYPE SOLID-STATE IMAGING DEVICE

The present invention generally relates to a solid-state imaging device and more particularly to a CCD type solid-state imaging device or imager of the interlaced scanning format of two-line simultaneous reading type.

The solid-state imaging device is required to exhibit the resolution substantially compatible with an electronic image pick-up tube used in the field of television broadcasting. To this end, there are required a matrix of pixels (photoelectric transducer elements) in an array of 500 (in vertical direction)×800 to 1000 (in horizontal direction) and a corresponding number of scanning elements. Under the circumstance, the solid-state imager is manufactured by resorting to MOS LSI (large-scale integrated circuit) technology capable of realizing a high density integration, whereby the pixels (photoelectric transducer elements) and charge transfer elements (charge-coupled-device or CCD in abridgement) or MOS transistors for reading optical information from the individual pixels are realized in the form of an intergrated circuit on a semiconductor substrate.

The CCD type solid-state imager provides advantages such as small size, light weight, low power consumption and maintenance-free performance, and promises the imaging device of next generation. However, the solid-state imager suffers from the problem that limitation is imposed on the number of the pixels, leading to a low resolution. More specifically, the number of the pixels in a solid-state imager fabricated by employing the MOS IC technology amounts to ca. 500 (in vertical direction)×400 (in horizontal direction) at most. Furthermore, since the interlacing format has to be so effective that odd-numbered lines are read out in a first field and even-numbered lines are scanned in the second field in consideration of restriction imposed by the structure of the vertical shift registers, 50% of photogenerated charge integrated in the preceding field remains in the succeeding field, i.e. occurrence of a so-called image lag phenomenon, involing the problem of low color resolution and others which are ascribable to the interlacing format.

In European patent application No. 82109194.9 filed on Oct. 5, 1982 in the name of Hitachi, Ltd. on the basis of Japanese Utility Model Application No. 149492/81 (corresponding to Japanese Utility Model Application Laid-Open No. 56458/83), and U.S. Ser. No. 423,466 with a view to dealing with the above problem, a CCD imager is disclosed in which plural lines can be simultaneously scanned or read out. This imager includes two rows of horizontal CCD shift registers, wherein the signal charge packets shifted through a first group of the vertical CCD shift registers are transferred to one of the horizontal CCD shift registers while the signal charge packets of the other group of vertical CCD shift registers are transferred to the other horizontal CCD shift register. These horizontal CCD shift registers transfer the signal charge packets to respective output circuits. With the proposed structure of the solid-state imager, the problem concerning the field lag and the low resolution can be solved to a satisfactory degree. However, the proposed imager suffers from a shortcoming that the transfer efficiency in the transfer of the output signal charge packets from the vertical CCD shift register to the horizontal CCD shift register is low.

An object of the present invention is to provide a solid-state imaging device or imager in which the drawback of low transfer efficiency is eliminated. Another object of the invention is to provide a solid-state imager which can assure an improved quality of image with high resolution which is free of image lag by realizing the interlaced scanning format of two-line simultaneous reading.

According to an aspect of the invention, there is provided a solid-state imaging device which includes coupling circuit means disposed between vertical CCD shift registers and a horizontal CCD shift register, wherein photogenerated signal charge packets of two signal series shifted through two adjacent columns of the vertical CCD shift registers, respectively, are converted through the coupling circuit means into a single time-sequential series of the signal charge packets to be sequentially transferred to the single horizontal CCD shift register beneath the storage electrodes thereof. The horizontal CCD shift register transfers the input signal charge packets sequentially or serially toward the output circuit.

The invention will be more apparent from the following description taken in conjunction with the accompanying drawings, in which:

FIG. 2 is a view showing a basic structure of a CCD type solid-state imager according to the above-mentioned prior application;

FIGS. 7a and 7b are views showing examples of color filter array employed in realizing the color CCD imager according to the invention.

Before entering into detailed description of the invention, a CCD type solid-state imager hitherto known and a CCD type solid-state imager according to the preceding proposal of the inventors will first be reviewed to facilitate the understanding of the present invention.

Figure 1:
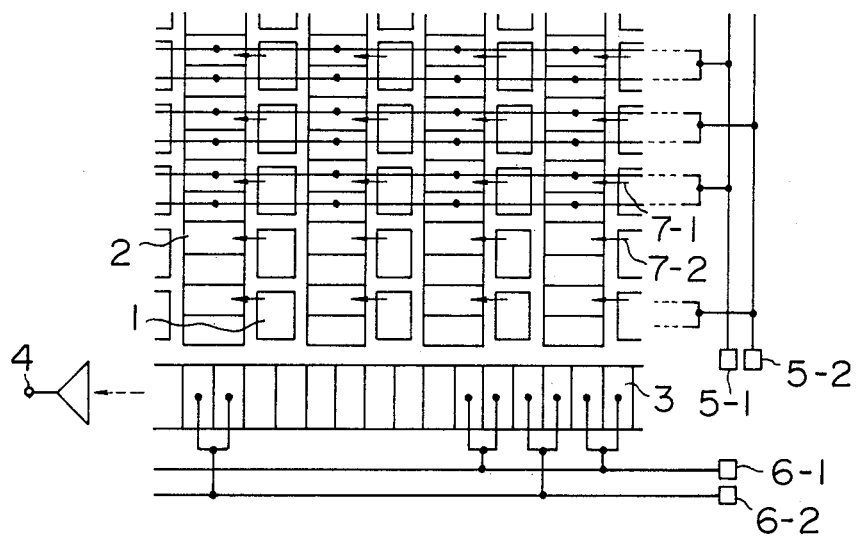
FIG. 1 is a view showing a basic structure of a hitherto known CCD type solid-state imager.

FIG. 1 is a diagram showing a basic structure of the hitherto known CCD type solid-state imager. Referring to the figure, 1 denotes photoelectric transducer elements (pixels) each of which may be constituted by a photodiode, 2 and 3 denotes, respectively, vertical CCD shift registers and a horizontal CCD shift register which serve to read out photogenerated signal charge packets stored in the photoelectric transducer elements or pixels to an output circuit 4, and 5 and 6 denote clock pulse generators for generating clock pulses to drive the vertical and horizontal CCD shift registers. Although two-phase clock pulse generator system is illustrated, it will be readily understood that the three-phase or four-phase clocking may be equally adopted. Reference numeral 7 denote transfer gates for transferring the signal charge packets stored in the photoelectric transducer elements or photodiodes to the vertical CCD shift registers 2. The solid-state imager of the illustrated configuration serves as a black and white imaging device. By providing a color filter array laminated on the structure, the individual photodiodes are furnished with color information, whereby the imager can serves as a color imaging device.

In the solid-state imager shown in FIG. 1, the interlacing is effected in such a manner in which odd-numbered lines designated by 7-1 in FIG. 1 are scanned in a first field and even-numbered lines designated by 7-2 are scanned in the second field under restriction imposed owing to the arrangement of the vertical shift registers, bringing about a so-called image lag phenomenon in which 50% of signal charges stored in the preceding field remain in the succeeding field, to a disadvantage. Besides, the hitherto known CCD imager shown in FIG. 1 surfers from other problems such as low color resolution and the like which are ascribable to the interlacing.

As an approach to deal with the problems mentioned above, there is proposed a CCD type solid-state imager of the structure shown in FIG. 2 in which two lines can be scanned simultaneously (reference is to be made to the above-mentioned European patent application No. 82109194.9).

In FIG. 2, reference numerals 2-1 and 2-2 denote paired columns of vertical CCD shift registers which are disposed in opposition to each other with an isolating or separating insulation zone 8 being interposed therebetween, 3-1 and 3-2 denote paired rows of horizontal CCD shift registers provided for transferring the photogenerated signal charge packets received from the associated vertical registers 2-1 and 2-2 to output circuits 4-1 and 4-2, respectively. The signal charge packets generated by the photodiodes 1-1 located on the odd-numbered lines are transferred to the vertical shift registers 2-1 through the transfer gates 7-3 while the signal charge packets of the photodiodes 1-2 are transferred to the vertical shift registers 2-2 through the transfer gates 7-4. On the other hand, the signal charge packets originating in the photodiodes 1-3 and 1-4 arrayed on the even-numbered lines are transferred to the verticl shift registers 2-2 and 2-1 through respective transfer gates 7-4 and 7-3. The signal charge packets supplied to the vertical shift registers 2-1 are transferred to the horizontal shift register 3-1 (refer to an arrow 9-1), while the signal charge packets read out to the vertical shift register 2-2 are transferred to the horizontal shift register 3-2 (refer to an arrow 9-2). As the consequence, the output circuit 4-1 is supplied with the signal charge packets from the vertical shift registers 2-1 (the signals originating in the photodiodes 1-1 and 1-4), while the signal charge packets from the vertical shift registers 2-2 (signals from the photodiodes 1-2 and 1-3) are transferred to the output circuit 4-2. In this way, the video signals obtained through the output circuits 4-1 and 4-2 include, respectively, the signals corresponding to two lines disposed vertically adjacent to each other (i.e. the signal derived from the photodiodes 1-1 of the odd-numbered lines and the photodiodes 1-4 of the even-numbered line on one hand and the signal derived from the photodiodes 1-2 of the odd-numbered line and the photodiodes 1-3 of the even-numbered lines on the other hand). Accordingly, by processing appropriately the signals produced from the two output circuits, the signals of two lines located vertically adjacent to each other can be obtained simultaneously within one horizontal scanning period. In other words, signals of two adjacent lines are simultaneously read out within the one horizontal scanning period, whereby the color video signal corresponding to the one horizontal scanning period is derived from the signal charge packets read out simultaneously from the two lines.

The interlacing can be realized by shifting the set of two lines by one line upon every field (more specifically, the sets of first and second lines, third and fourth lines, fifth and sixth lines and so forth are, respectively, scanned or read out simultaneously in the first field, while the sets of the second and third lines, fourth and fifth lines, sixth and seventh lines and so forth are, respectively, read out simultaneously in the second field). The interlaced scanning format of such two-line simultaneous reading type is disclosed in Japanese patent application Laid-Open Nos. 56123/1976 corresponding to U.S. Pat. No. 4,117,510 and 57123/1976.

In the case of the solid-state imager shown in FIG. 2, it is certainly possible to adopt the interlaced scanning format of two-line simultaneous reading type in an effort to deal with the problem of the field lag and the low resolution mentioned hereinbefore.

In this conjunction, it must be pointed out that although it is possible theoretically to provide two rows of the horizontal CCD shift registers 3-1 and 3-2, there arises in practice another difficulty that the transfer of the signal charge packets shifted through the vertical CCD shift registers 2-2 to the horizontal CCD shift registers 3-2 (refer to the arrow 9-2) is accompanied with remarkable degradation in the transfer efficiency.

With the present invention, it is intended to provide a solid-state imager which is free of the shortcomings described above.

In the following, exemplary embodiments of the invention will be described in detail by referring to FIGS. 3 et seq.

Figure 3:
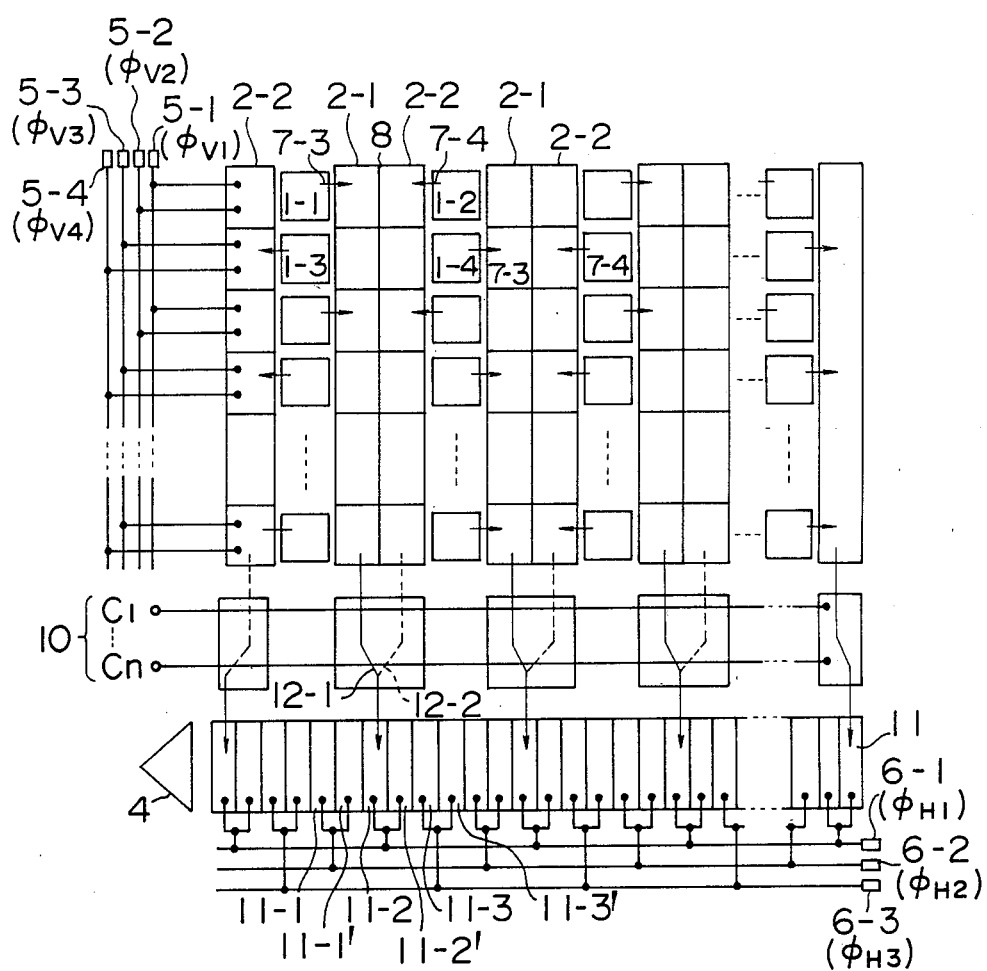
FIG. 3 is a view showing a circuit configuration of a CCD type solid-state imager according to an embodiment of the invention.

FIG. 3 shows a basic arrangement of a CCD type solid-state imager according to an embodiment of the present invention.

Referring to the figure, a reference numeral 10 denotes a coupling circuit provided between the horizontal CCD shift register 11 and the vertical CCD shift registers 2-1 and 2-2. The coupling circuit 10 is adapted to be driven by N clock pulses $C_1, C_2, \ldots, C_N$ where N is an integer not less than 1. The horizontal CCD shift register 11 is assumed to be driven by three-phase clock pulses $\phi_{H1}$, $\phi_{H2}$ and $\phi_{H3}$ supplied from pulse generators 6-1, 6-2 and 6-3, respectively, by way of example. Each unit stage of the horizontal CCD shift register 11 is composed of three sets of CCD electrodes (11-1, 11-1'), (11-2, 11-2') and (11-3, 11-3'). The photogenerated signal charge packets (hereinafter referred to as the signals of series A) of the photodiodes 1-1 and 1-4 shifted through the vertical CCD shift registers 2-1 and the photogenerated signal charge packets (hereinafter referred to as the signals of series B) of the photodiodes 1-2 and 1-3 shifted through the vertical shift registers 2-2 are converted into a single time-sequential signal series including the signal of series A and the signal of series B in this order through the coupling circuit 10 to be subsequently transferred to the horizontal CCD shift register 11. More specifically, among the signal charge packets of the two signal series A and B shifted simultaneously through the vertical CCD shift registers 2-1 and 2-2, the signal charge packets of series A are first transferred to the horizontal CCD shift register 11 beneath the electrodes 11-2 by way of the coupling circuit 10, whereupon the signal charge packets of series A are subsequently shifted by one set of the electrodes through the horizontal CCD shift register 11 in the direction toward the output circuit 4 to be transferred to the sites beneath the electrodes 11-1 (refer to an arrow 12-1). Upon completion of the operation mentioned above, the signal charge packets of series B temporarily stored and held in the coupling circuit 10 are then transferred to the electrodes 11-2 of the horizontal CCD shift register 11 which are empty at that time (refer an arrow 12-2). In this manner, among the triplets of electrodes which constitute the horizontal CCD shift register 11, the signal charge packets of series A and B are placed below the two adjacent electrodes (11-1 and 11-2 in the case of the illustrated embodiment with the electrodes 11-3 being empty or idle). These two series of signal charge packets are transferred through the horizontal shift register 11 toward the output end thereof in the sequence of signals of A series, signals of B series, empty, signals of A series, signal of B series, empty and so on under shifting operation of the register 11. This kind of transfer operation is hereinafter referred to as the duplicate transfer operation.

Figure 4A:
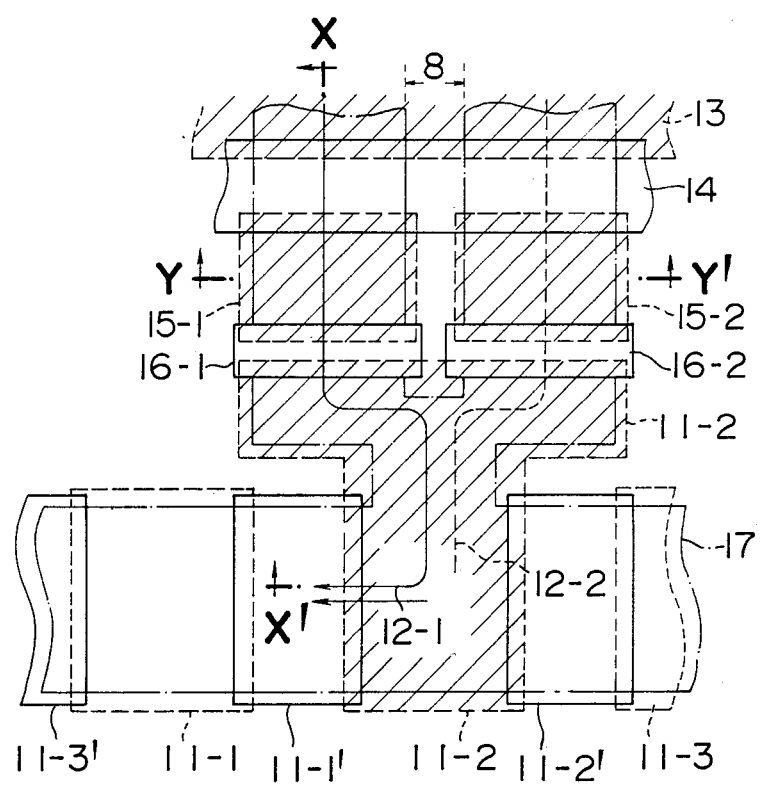
FIGS. 4a, 4b and 4c show, respectively, in a plane view and sectional views a main portion of the structure of the CCD imager according to an embodiment of the invention.
Figure 4B:
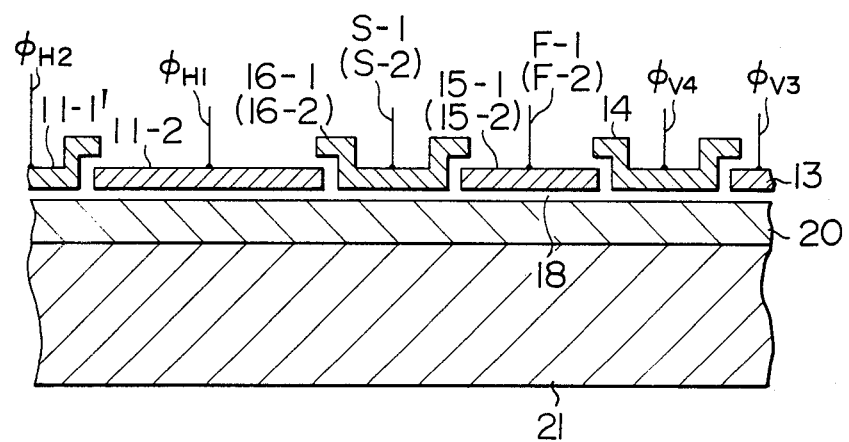
Figure 4C:
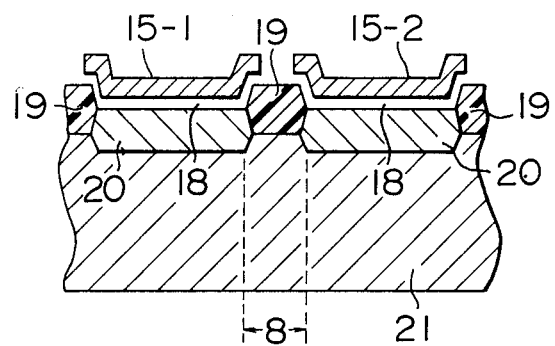

A structure of the coupling circuit 10 according to an embodiment of the invention is shown in FIGS. 4a, 4b and 4c, wherein FIG. 4a is a view illustrating a planar layout of the coupling circuit and FIG. 4b shows a sectional view of the same taken along the arrowed line 12-1 (line X—X') in FIG. 4a. In FIG. 4b, reference symbols within brackets designate those parts which make appearance in a cross-sectional view taken along the arrowed line 12-2 in FIG. 4a. FIG. 4c is a sectional view taken along the line Y—Y' in FIG. 4a. In these figures, reference numerals 13 and 14 denote electrodes of the final stages of the vertical CCD shift registers 2-1 and 2-2, respectively. The electrodes 13 and 14 are supplied with vertical clock pulses $\phi_{V3}$ and $\phi_{V4}$, respectively. Numerals 15 and 16 denote electrodes which constitute the coupling circuit 10, while 11 denotes electrodes constituting the horizontal CCD shift register. These electrodes are indicated by solid lines and broken lines. The area indicated as enclosed by a single-dot line 17 is a region in which the transfer of signal charge packets takes place, i.e. the channel region. A numeral 8 indicates a region in which the transfer of signal charge packets is inhibited, i.e. the isolating insulation zone which is usually formed of an oxide film 19 having a thickness several ten times thicker than a gate oxide film 18 which forms the channel region 17. A reference numeral 20 denotes a layer containing impurities or dopants of conductivity type (e.g. n-type) opposite to that of the substrate 21 (e.g. p-type). This impurity layer 20 is provided to realize the buried channel. When the imager is to be realized as the surface-channel device, the impurity layer 20 is of course unnecessary. The CCD electrodes 13, 15-1, 15-2, 11-1, 11-2 and 11-3 can be formed of polycrystalline silicon of a first layer while the CCD electrodes 14, 16-1, 16-2, 11-1', 11-2' and 11-3' may be formed of polycrystalline silicon of a second layer, by way of example.

Figure 5A:
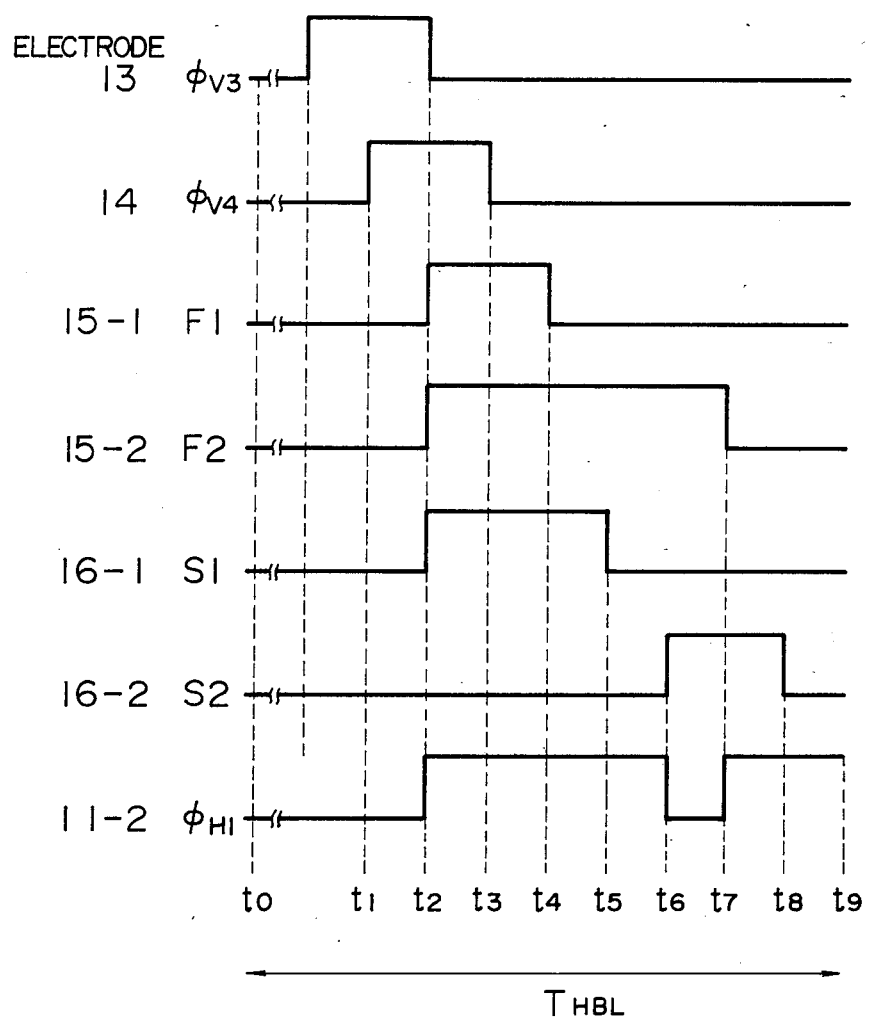
FIG. 5a illustrates in a time chart the pulses employed for driving the CCD imager according to the invention.
Figure 5B:
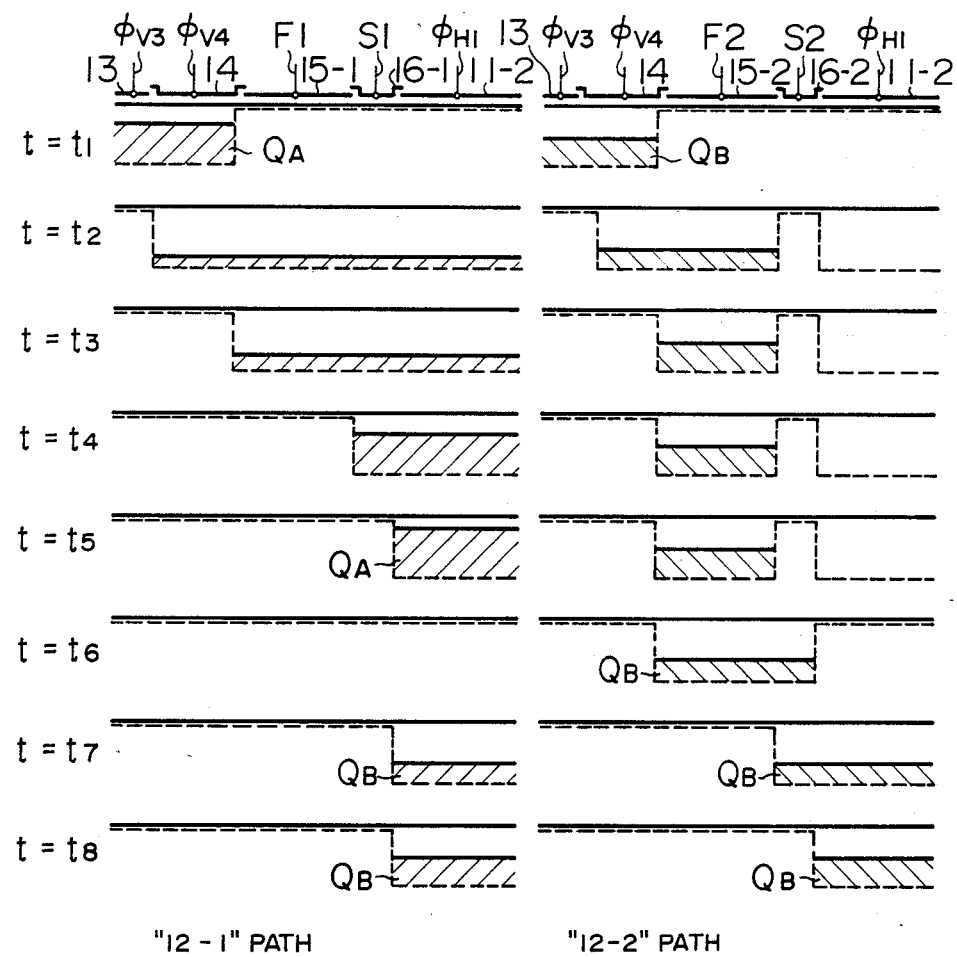
FIG. 5b is a view for illustrating operation of the same.

FIG. 5a shows in signal timing diagrams the pulses for driving the CCD type solid-state imager according to the invention, and FIG. 5b is a view for illustrating operation of the imager.

Now, the charge transfer operation from the vertical CCD shift registers to the horizontal CCD shift register in the CCD type solid-state imager shown in FIGS. 4a to 4c will be described by referring to FIGS. 5a and 5b.

Among four-phase clock pulses $\phi_{V1}$, $\phi_{V2}$, $\phi_{V3}$ and $\phi_{V4}$, the clock pulses $\phi_{V3}$ and $\phi_{V4}$ are applied to the final stages of the vertical CCD shift registers. A period from a time point $t_0$ to a time point $t_9$ corresponds to a horizontal blanking period $T_{HBL}$. The charge transfer from the vertical CCD shift registers to the horizontal CCD shift register by way of the coupling circuit is carried out within the horizontal blanking period $T_{HBL}$.

At a time point $t_1$, the driving pulse signals $\phi_{V3}$ and $\phi_{V4}$ are both at level "1" (voltage of high level), and charge packets $Q_A$ of the signal series A shifted through the vertical CCD shift registers 2-1 are stored beneath the final stage electrodes 13 and 14 located on the left side to the isolating insulation zone 8 as viewed in FIG. 4a, while charge packets $Q_B$ of the signal series B shifted through the vertical CCD shift registers 2-2 are stored beneath the final stage electrodes 13 and 14 located on the right side to the isolating insulation zone 8 as viewed in FIG. 4a (refer to FIG. 5b at $t=t_1$). At a time point $t_2$, the pulses F1, S1 and $\phi_{H1}$ of level "1" are applied, respectively, to the electrodes 15-1 and 16-1 for the signal series A and the electrodes 11-2 of the horizontal CCD shift register, while the pulse $\phi_{V3}$ is reset to the level "0" (e.g. 0 volt), whereby the charge packets $Q_A$ are stored beneath the electrodes 14, 15-1, 16-1 and 11-2 (refer to FIG. 5 at $t_2$). On the other hand, charge packets $Q_B$ of the signal series B are stored beneath the electrodes 14 to which the pulse $\phi_{V4}$ of level "1" is applied and the electrodes 15-2 to which the pulse F2 of level "1" is applied, at the time point $t_2$ (refer to FIG. 5b at $t_2$). Next, at a time point $t_3$, the pulse $\phi_{V4}$ is reset to the level "0", whereby the charge packets $Q_A$ are stored beneath the electrodes 15-1, 16-1 and 11-2 while the charge packets $Q_B$ are stored only beneath the electrodes 15-2 (refer to FIG. 5b at $t_3$). At a time point $t_4$, the pulse F1 is reset to the level "0", as the result of which the charges $Q_A$ are stored beneath the electrodes 16-1 and 11-2 (refer to FIG. 5b at $t_4$). At a time point $t_5$, the signal S1 is reset to the level "0", whereby the charge packets $Q_A$ are transferred to the horizontal CCD shift register beneath the electrodes 11-2 (refer to FIG. 5b at $t_5$). At a time point $t_6$, the pulse signal $\phi_{H1}$ is rest to the level "0" with the pulse $\phi_{H2}$ applied to the electrodes 11-1 and 11-1' rising up to the level "1", resulting in that the charge packets $Q_A$ beneath the electrodes 11-2 are shifted to the sites beneath the electrodes 11-1 by way of the electrodes 11-1'. As the result, charge packets beneath the electrodes 11-2 disapper, whereupon the transfer of charge packets $Q_A$ to the horizontal CCD shift register is completed. On the other hand, the charge packets $Q_B$ of the signal series B are stored beneath the electrodes 15-2 and 16-2 at the time point $t_6$ because the pulse S2 of the level "1" is applied to the electrodes 16-2 (refer to FIG. 5b at $t_6$). At a time point $t_7$, the pulse signal F2 is reset to the level "0" with the pulse $\phi_{H1}$ of level "1" being again applied to the electrodes 11-2, resulting in that the charge packets $Q_B$ are stored beneath the electrodes 16-2 and 11-2 (refer to FIG. 5b at $t_7$). At a time point $t_8$, the pulse signal S2 is reset to the level "0", whereby the charge packets $Q_B$ are shifted to the positions underlying the electrodes 11-2, which means that the transfer of charge packets $Q_B$ to the horizontal CCD shift register has been completed (refer to FIG. 5b at $t_8$).

Through the processes described above, charge packets $Q_A$ and $Q_B$ of the signal series A and B are both transferred to the horizontal CCD shift register. As the result, there are stored beneath the two adjacent electrodes 11-1 and 11-2 of the horizontal CCD shift register the charge packets $Q_A$ and $Q_B$ which are shifted through the horizontal CCD shift register toward the output end thereof as the horizontal clock pulses $\phi_{H1}$, $\phi_{H2}$ and $\phi_{H3}$ of the levels "1" and "0" are repeatedly applied after the horizontal blanking period. In this manner, the signals of two series can be taken out sequentially through the output circuit 4. In the meanwhile, the electrodes 11-3 remain empty.

The foregoing description with reference to FIG. 3, FIGS. 4a to 4c and FIGS. 5a and 5b has been made on the assumption that the four-phase vertical clock pulses are employed. However, it will be readily understood that two-phase or three-phase vertical clock pulses may be used to accomplish the utterly same operation as described above. Further, four-phase horizontal clock pulses may be used in place of the three-phase clock pulses mentioned above to perform the duplicate transfer operation for extracting sequentially the signals of two series A and B.

Figure 6:
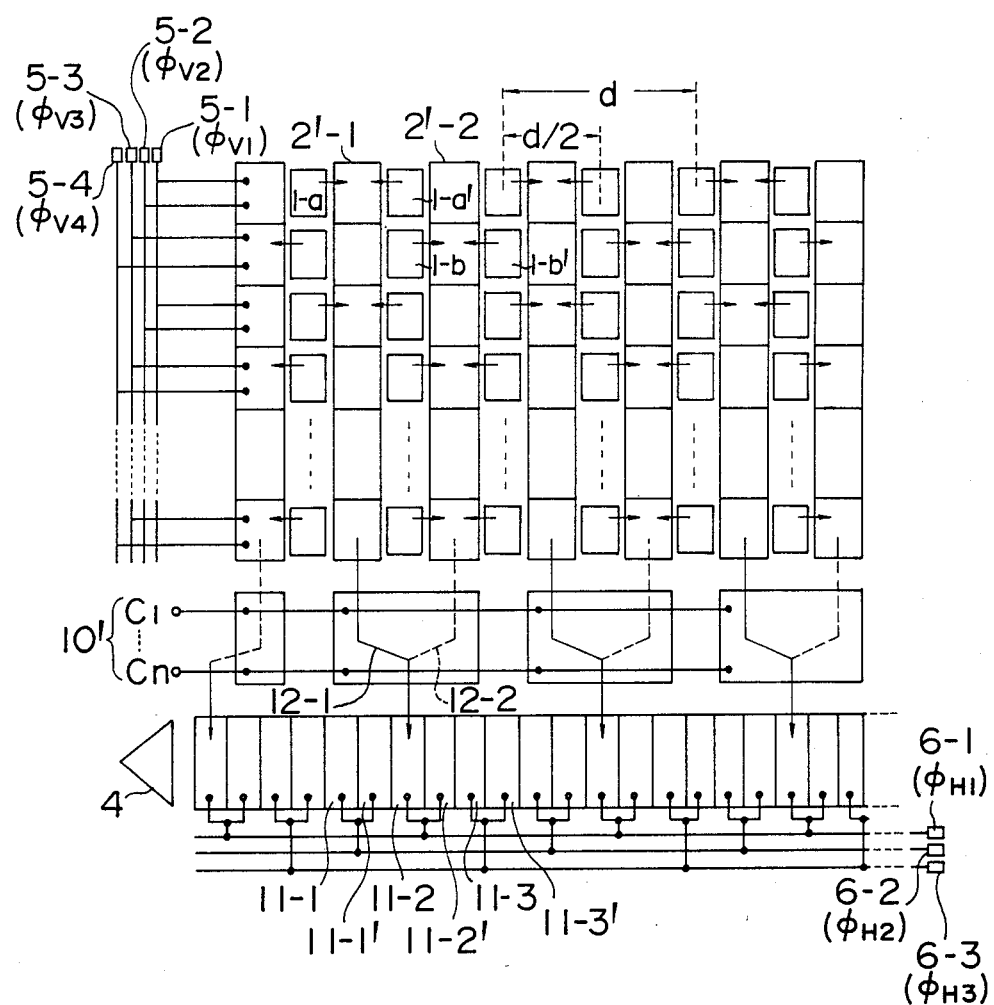
FIG. 6 is a view showing a circuit configuration of the CCD type solid-state imager according to another embodiment of the invention.

FIG. 6 shows a structure of the solid-state imager according to another embodiment of the invention in which the vertical CCD shift registers are completely separated from one another.

More specifically, in the solid-state imager device shown in FIG. 6, the vertical CCD shift registers 2'-1 and 2'-2 are not provided in opposite to each other with the isolating insulation zone 8 being interposed therebetween as is the case of the device shown in FIG. 3 but completely separated from each other, wherein the shift registers 2'-1 and 2'-2 are disposed with a same distance d/2 (where d represents distance between the adjacent pixels in the horizontal repetitional array) in the horizontal direction in a periodically repeated pattern. Reference symbols 1-a and 1-a' or 1-b and 1-b' represent photodiodes which constitutes a same pixel, wherein the photogenerated signal charge packets of the photodiodes 1-a and 1-a' are sent to the same vertical register 2'-1 while the photogenerated signal charge packets of the photodiodes 1-b and 1-b' are supplied to the same vertical register 2'-2 to be shifted therethrough.

The solid-state imager shown in FIG. 6 can enjoy a higher resolution when compared with the embodiment shown in FIG. 3 by virtue of such arrangement that the photodiodes 1-a of the odd-numbered lines and the photodiodes 1-b of the even-numbered lines are disposed with a shift of d/2 between the lines located adjacent to each other in the vertical direction. In FIG. 6, 10' denotes the coupling circuits which convert the photo-generated signal charge packets of two series A and B transferred simultaneously from the vertical CCD shift registers 2'-1 and 2'-2 into a single time-sequential series signal. The charge transfer operation to and from the coupling circuits 10' to the horizontal CCD shift register 11 is performed in the same manner as described hereinbefore in conjunction with FIG. 5, whereby the signals of two series A and B can be obtained through the output circuit 4 in an alternate sequence of 1-a, 1-b, 1-a, 1-b and so forth.

In the foregoing, the embodiments of the invention have been described in conjunction with the interline type CCD imaging device which is used most commonly. It will however be understood that the invention can equally be applied to the frame transfer type CCD imaging devices.

Further, in the foregoing description, the invention is assumed to be applied to black-and-white imaging devices with the intention not to unduly restrict the concept of the invention. However, structure and operation of the imagers described hereinbefore are retained utterly same in the case of the color applications.

Figures 7A, 7B:
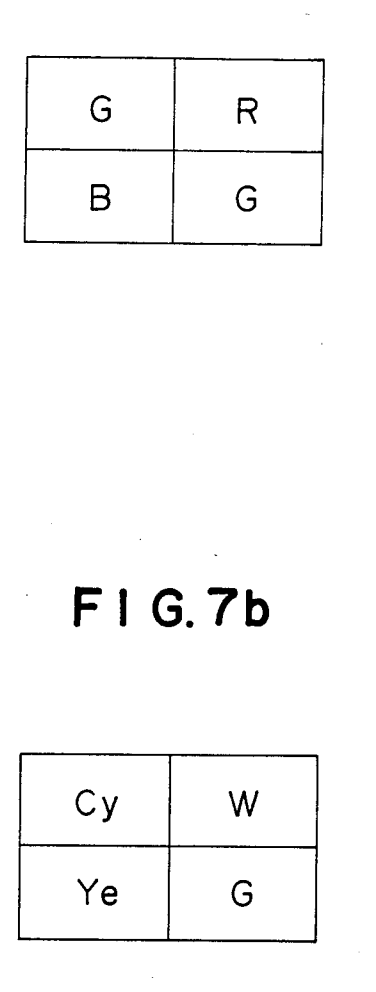

FIGS. 7a and 7b show an example of a color filter array which can be used for implementing the device according to the invention in a color CCD imager. More specifically, FIG. 7a shows a primary-color filter array and FIG. 7b shows a complementary-color filter array.

In the case of the primary-color filter array, the photodiodes 1-1 and 1-4 correspond to G (green), while the photodiodes 1-2 correspond to R (red) with the photodiodes 1-3 corresponding to B (blue). Accordingly, the color video signal derived through the output circuit 4 induces the color components in the sequence of B, G, R, G, B, G, R, and so forth. On the other hand, when the complementary-color filter array composed of color sections of Cy (cyan), Ye (yellow), G (green) and W (white) as shown in FIG. 7b, the color video signal consisting of the sequence of Ye, Cy, W, G, Ye, Cy and so forth is produced through the output circuit.

It will now be appreciated that the present invention has provided a CCD imaging device or image of the interlacing format of two-line simultaneous reading type in which a coupling circuit is disposed between the vertical CCD shift registers and the horizontal CCD shift register for converting two series of signals read out simultaneously from two lines into a single time-serial series signal, whereby the field lag is substantially reduced with the resolution being significantly improved. Besides, various color filter arrays with high resolution can be used to allow the solid-state imaging device to be realized in a CCD color imaging device which can assure improved image quality when compared with the hitherto known imagers.

We claim:

1. A solid-state imaging device, comprising:
a number of photodiodes disposed in a two-dimensional regular array;
a plurality of vertical CCD shift registers for transferring photogenerated signal charge packets produced by a first series of said photodiodes;
a plurality of vertical shift registers for transferring photogenerated signal charge packets produced by a second series of said photodiodes;
a single horizontal CCD shift register for transferring output charge packets of said vertical CCD shift registers to an output circuit; and
a coupling circuit disposed between said vertical CCD shift registers and said horizontal CCD shift register, wherein said coupling circuit transfers the signal charge packets of the first and second series outputted from the adjacent two of said vertical CCD shift registers, respectively, beneath storage electrodes of said horizontal CCD shift register alternately on the time-serial basis.

2. A solid-state imaging device, comprising:
a number of photodiodes disposed in a two-dimensional regular array;
plural sets of vertical CCD shift registers arrayed regularly between columns of said photodiodes, each of said sets including a pair of columns of said vertical CCD shift registers which are disposed adjacent to each other and insulated electrically from each other;
a single row of horizontal CCD shift register for transferring the output charge packets from said vertical CCD shift registers to an output circuit; and a coupling circuit disposed between said sets of the vertical CCD shift registers and said horizontal CCD shift register;

wherein one of two columns of said vertical CCD shift registers constituting each of said sets transfers photogenerated signal charge packets produced by a first series of said photodiodes while the other column of said vertical CCD shift registers of the same set transfers photogenerated signal charge packets produced by a second series of said photodiodes which differs from said first series; and said coupling circuit transfers two series of signal charge packets outputted from said two columns of the vertical CCD shift registers constituting each of said sets to said horizontal CCD shift register beneath storage electrodes thereof alternately on the time-serial basis.

3. A solid-state imaging device, comprising:

a plurality of photodiodes disposed in a two-dimensional regular array;

plurality columns of vertical CCD shift registers disposed alternately with columns of said photodiodes;

a single row of horizontal CCD shift register for transferring output signal charge packets of said vertical CCD shift registers to an output circuit; and coupling circuits each disposed between said horizontal CCD shift register and two columns of said vertical CCD shift registers disposed adjacent to each other with the column of said photodiodes being interposed therebetween;

wherein said two columns of the vertical CCD shift registers disposed adjacent to each other with the column of said photodiodes being interposed therebetween transfer photogenerated signal charge packets produced by mutually different series of said photodiodes, respectively;

each of said coupling circuits transferring two series of the photogenerated signal charge packets outputted from said two columns of the vertical CCD shift registers to said horizontal CCD shift register beneath storate electrodes thereof alternately on the time-serial basis.

4. A solid-state imaging device according to claim 1, wherein said horizontal CCD shift register includes three sets of CCD electrodes driven by three-phase pulses for thereby transferring the signal charge packets of said two series by way of first and second sets or second and third sets of said CCD electrodes.

5. A solid-state imaging device according to claim 2, wherein said horizontal CCD shift register includes three sets of CCD electrodes driven by three-phase pulses for thereby transferring the signal charge packets of said two series by way of first and second sets or second and third sets of said CCD electrodes.

6. A solid-state imaging device according to claim 3, wherein said horizontal CCD shift register includes three sets of CCD electrodes driven by three-phase pulses for thereby transferring the signal charge packets of said two series by way of first and second sets or second and third sets of said CCD electrodes.

* * * * *